United States Patent

(12) United States Patent
Kim et al.

(10) Patent No.: US 11,512,396 B2
(45) Date of Patent: Nov. 29, 2022

(54) METHOD FOR DOPING USING ELECTRIC FIELD

(71) Applicant: KOREA UNIVERSITY RESEARCH AND BUSINESS FOUNDATION, Seoul (KR)

(72) Inventors: Taegeun Kim, Seongnam-si (KR); Kyungrock Son, Seoul (KR)

(73) Assignee: KOREA UNIVERSITY RESEARCH AND BUSINESS FOUNDATION, Seoul (KR)

(*) Notice: Subject to any disclaimer, the term of this patent is extended or adjusted under 35 U.S.C. 154(b) by 125 days.

(21) Appl. No.: 16/941,822

(22) Filed: Jul. 29, 2020

(65) Prior Publication Data
US 2021/0140053 A1 May 13, 2021

(30) Foreign Application Priority Data
Nov. 12, 2019 (KR) .................. 10-2019-0144399

(51) Int. Cl.
C23C 28/00 (2006.01)
H01L 21/3215 (2006.01)
C25D 15/00 (2006.01)
C04B 41/00 (2006.01)
C23C 10/28 (2006.01)

(52) U.S. Cl.
CPC ........ C23C 28/345 (2013.01); C04B 41/0027 (2013.01); C23C 10/28 (2013.01); C25D 15/00 (2013.01); H01L 21/3215 (2013.01); C04B 2235/3293 (2013.01)

(58) Field of Classification Search
CPC .................................................. C23C 28/345
See application file for complete search history.

(56) References Cited

U.S. PATENT DOCUMENTS
2016/0322568 A1 11/2016 Fadhel et al.

FOREIGN PATENT DOCUMENTS
KR 10-2002-0027775 A 4/2002
KR 10-0613405 B1 8/2006
KR 10-2007-0070336 A 7/2007
KR 10-2012-0123982 A 11/2012
KR 10-1436133 B1 9/2014
KR 10-1439530 B1 9/2014
KR 10-2014-0117155 A 10/2014
(Continued)

OTHER PUBLICATIONS

Yong Woon Kim et al. Tailoring Opto-electrical properties of ultra-thin indium tin oxide films via filament doping: Applicantion as a transparent cathode for indoor organic photovoltaics. Apr. 2, 2019. Journal of Power Sources. 424 pp. 165-175 (Year: 2019).*

(Continued)

Primary Examiner — Dah-Wei D. Yuan
Assistant Examiner — Kristen A Dagenais-Englehart
(74) Attorney, Agent, or Firm — Hauptman Ham, LLP

(57) ABSTRACT

A doping method using an electric field includes stacking a sacrificial layer on a doped layer, disposing a doping material on the sacrificial layer, disposing electrodes on the doping material and the doped layer, respectively, and doping the doping material into the doped layer through oxidation, diffusion, and reduction of the doping material by the electric field.

9 Claims, 15 Drawing Sheets

(56) References Cited

FOREIGN PATENT DOCUMENTS

| KR | 10-2015-0032279 A | 3/2015 |
| KR | 10-1508574 B1 | 4/2015 |
| KR | 10-1543689 B1 | 8/2015 |

OTHER PUBLICATIONS

Korean Notice of Allowance dated Sep. 9, 2021, in connection with the Korean Patent Application No. 10-2019-0144399.
Miyung-Sic Chae et al., "Electrochemically metal-doped reduced graphene oxide films: Properties and applications", Journal of Materials Science & Technology 40 (2020), p. 72-p. 80.
Kong Woon Kim et al., "Tailoring Opto-electrical properties of ultra-thin indium tin oxide films via filament doping: Application as a transparent cathode for indoor organic photovoltaics", Journal of Power Sources 424 (2019), p. 165-p. 175.
Myung-Sic Chae et al., "Electrically-doped CVD-graphene transparent electrodes: application in 365 nm light-emitting diodes", Nanoscale Horizons, 2019, 4, p. 610-p. 618.

\* cited by examiner

Before doping

After doping

METHOD FOR DOPING USING ELECTRIC FIELD

CROSS-REFERENCE TO RELATED APPLICATIONS

This application is based on and claims priority under 35 U.S.C. § 119 to Korean Patent Application No. 10-2019-0144399 filed on Nov. 12, 2019, in the Korean Intellectual Property Office, the disclosure of which is incorporated by reference herein its entirety.

BACKGROUND

Embodiments of the inventive concept described herein relate to a doping method using an electric field.

Semiconductor doping refers to adding necessary impurities in a semiconductor crystal with a desired amount and is also referred to as adding impurities. A semiconductor electrical conduction is affected by impurities, and therefore it is necessary to control the contained impurities in semiconductor engineering.

Methods for doping include ion implantation, thermal diffusion, metal-organic chemical vapor deposition (MOCVD), and co-deposition.

The ion implantation method refers to a method including ionizing elements to be doped, accelerating the ions with an electric field so that the ions have enough energy to penetrate a thin layer or semiconductor surface sufficiently, and putting the ions into the thin layer or semiconductor. The ion implantation method is used to precisely control an amount of doping but is applied only to a relatively small area. The ion implantation process may forcibly inject the ions into the thin layer or semiconductor surface, and thus the thin layer and the semiconductor may be physically damaged and then a recovery process through heating is essential.

The thermal diffusion method refers to a doping method including supplying doping particles in a gaseous form and heating the doping particles at a high temperature to diffuse the doping particles into the thin layer or semiconductor, similar to an oxidation process. The thermal diffusion method may be relatively inexpensive and may easily perform the doping. However, it is difficult to precisely control a concentration because the impurities are doped by a simple diffusion phenomenon and a process temperature is very high.

The MOCVD method refers to a chemical vapor deposition method in which a raw material gas is discharged on a high-temperature substrate, and a decomposition reaction occurs on its surface to form a thin layer. The thin layer or semiconductor to be doped is put in equipment and elements to be doped are vaporized to induce a reaction with the semiconductor. Among the raw material gases, organic metal raw materials such as trimethylgallium are mainly used, and mainly used to grow GaN and GaAs-based semiconductor thin layers. The method is capable of evenly doping large areas, but requires a very high process temperature.

The co-deposition method, when a thin layer to be doped is deposited through a deposition method such as sputtering and evaporation, a source of elements to be doped is also deposited simultaneously using the same method to form a doped thin layer. The method may dope over a large area but requires more than two power sources.

Most of these conventional methods use a high power source accompanied by a high temperature process to place the doped particles in the thin layer or the surface or interior of the semiconductor to be doped using a physical or chemical method.

In addition, the doping process is performed in a high vacuum environment to obtain a high-purity doped thin layer, and therefore the process is very complicated and requires a large cost.

SUMMARY

Embodiments of the inventive concept provide a doping method using an electric field that is capable of being performed at room temperature and atmospheric pressure.

The technical objects to attain in the inventive concept are not limited to the above-described technical objects and other technical objects which are not described herein will become apparent to those skilled in the art from the following description.

According to an exemplary embodiment, a doping method using an electric field includes stacking a sacrificial layer on a doped layer, disposing a doping material on the sacrificial layer, disposing electrodes on the doping material and the doped layer, respectively, and doping the doping material into the doped layer through oxidation, diffusion, and reduction of the doping material by the electric field.

The doping of the doping material into the doped layer may include oxidizing and ionizing the doping material, diffusing the ionized doping material by passing though the sacrificial layer by electrostatic attraction, allowing the ionized doping material to pass though the sacrificial layer by electrostatic attraction to be diffused into the doped layer, and reducing the diffused doping material in the doped layer.

The doping method using the electric field may further comprise removing the sacrificial layer after the doping of the doping material into the doped layer.

The doped layer may include at least one of ITO, a metal oxide film, graphene, carbon nanotubes, metal mesh, and metal nanowires.

The sacrificial layer may be provided with a dielectric material.

The dielectric material may include at least one of aluminum nitride (AlN) and zinc oxide (ZnO).

The sacrificial layer may be 10 nanometers to 20 nanometers.

The disposing of the electrode on the doping material and the doped layer, respectively, may include disposing a first electrode on the doping material and disposing a second electrode on the doped layer.

The first electrode may be a positive electrode and the second electrode may be a negative electrode.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1A:
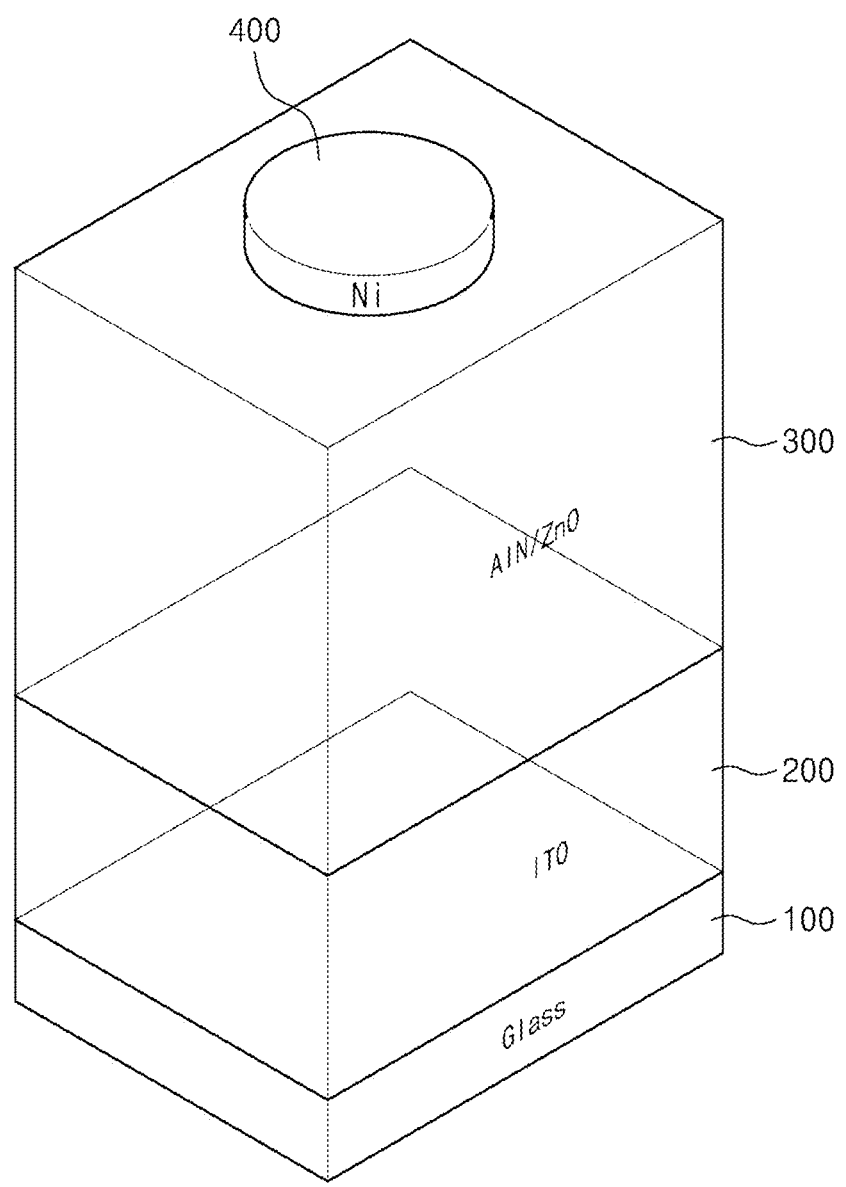
FIGS. 1A to 1C are views schematically illustrating a doping process using an electric field according to an embodiment of the inventive concept.

Other advantages and features of the inventive concept, and implementation methods thereof will be clarified through following embodiments to be described in detail with reference to the accompanying drawings. The inventive concept may, however, be embodied in different forms and should not be construed as limited to the embodiments set forth herein. Rather, these embodiments are provided so that this disclosure is thorough and complete and fully conveys the scope of the inventive concept to a person skilled in the art to which the inventive concept pertains. Further, the inventive concept is only defined by scopes of claims.

Although some terms are not defined, all the terms used herein (including technology or science terms) have the same meanings as those generally accepted by typical technologies in the related art to which the inventive concept pertains. The terms defined in general dictionaries may be construed as having the same meanings as those used in the related art and/or a text of the present application and even when some terms are not clearly defined, they should not be construed as being conceptual or excessively formal.

The terminology used herein is for the purpose of describing particular aspects only and is not intended to be limiting of the disclosure. In the specification, a singular form also includes a plural form unless otherwise specified in a phrase. It will be further understood that the terms "comprises" and/or "comprising," when used in this specification, specify the presence of stated compositions, components, constitutes, steps, operations, and/or devices, but do not preclude the presence or addition of one or more other compositions, components, constitutes, steps, operations, and/or devices. As used herein, the term "and/or" includes any and all combinations of one or more of the associated listed items.

As used herein, the suffixes "unit", "device", "block" and "module" may refer to a unit in which at least one function or operation is processed. For example, these terms may refer to software components or hardware component to such as field programmable gate array (FPGA) or application specific integrated circuits (ASIC). However, "unit", "device", "block" and "module" are not limited to software or hardware. The "unit", "device", "block" and "module" may be configured to be present on an addressable storage medium and configured to reproduce one or more processors.

Therefore, exemplary embodiments of the "unit", "device", "block" and "module" may be implemented by software or hardware components. The software component may comprise object-oriented software components, class components, and task components, and processes, functions, attributes, procedures, subroutines, segments of a program code, drivers, firmware, a micro code, a circuit, data, a database, data structures, tables, arrays, and variables. Functions provided by different components, "unit", "device", "block" and "module" may be combined into a smaller number of components, "units", "devices", "blocks" and "modules" or may be further separated into additional components, "units", "devices", "blocks" and "modules".

Hereinafter, embodiments of the inventive concept will be described in detail with reference to the accompanying drawings in the specification.

In a doping method using an electric field according to an embodiment of the inventive concept, a sacrificial layer, which is a dielectric thin layer, is stacked on a doped layer, which is a subject to be doped.

A doping material, which is a material to be doped to the doped layer, is disposed on the sacrificial layer.

Thereafter, a positive electrode is disposed on the doping material and a negative electrode is disposed on the doped layer, and when a voltage is applied to both electrodes, an electric field is formed on the sacrificial layer provided between both electrodes.

Here, the formed electric field ionizes the doping material and an ionized doping material passes through the sacrificial layer and moves to the doped layer.

The ionized doping material moved to the doped layer encounters electrons in the doped layer and is reduced, and therefore the doped layer is doped in this process.

Hereinafter, the doping method will be described in more detail.

Figure 1B:
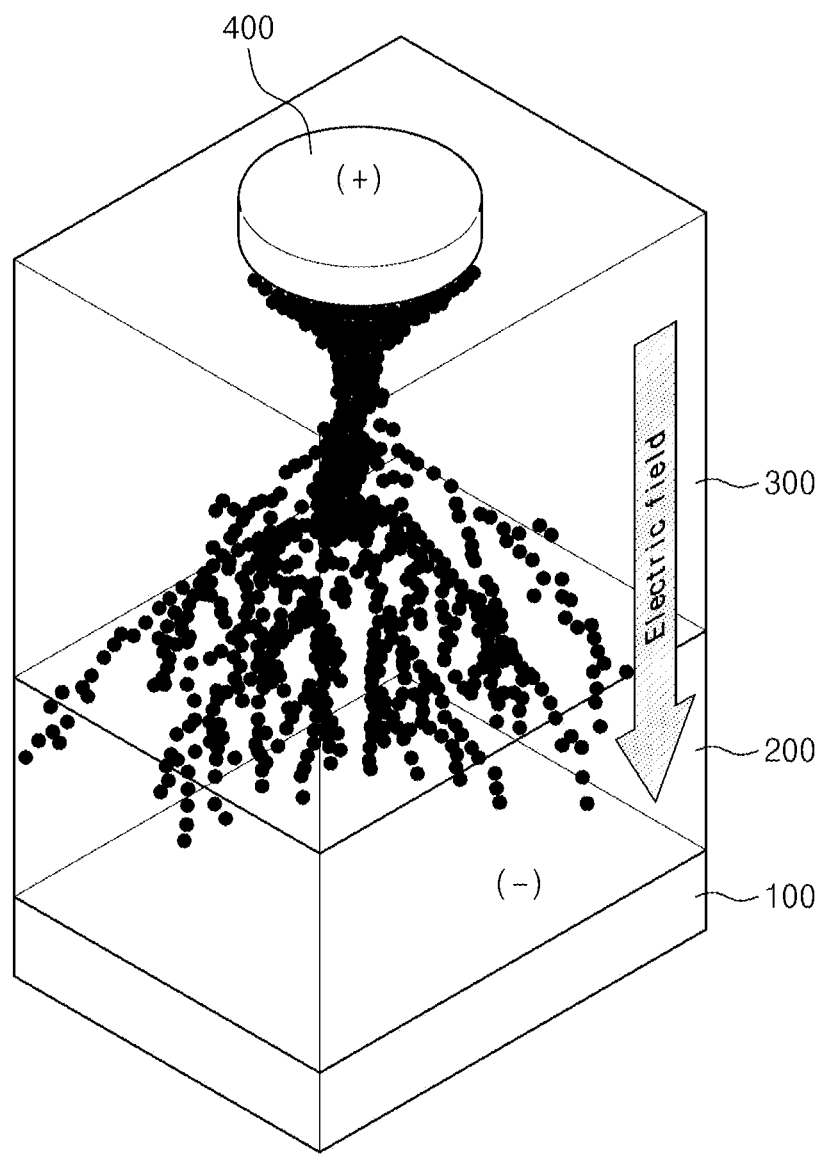
Figure 1C:
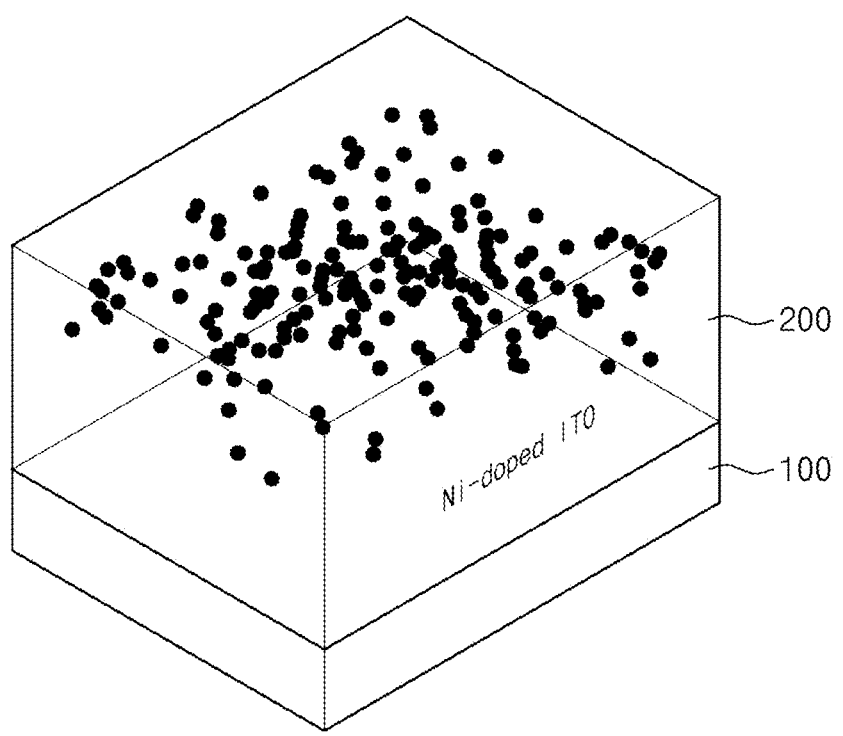

FIGS. 1A to 1C are views schematically illustrating a doping process using an electric field according to an embodiment of the inventive concept.

Referring to FIG. 1A, the doped layer 200 to be doped is stacked on a substrate 100. The sacrificial layer 300 which is a dielectric layer is stacked on the doped layer 200 and the doping material 400 which is a material to be doped is disposed on the sacrificial layer 300.

Referring to FIG. 1B, a (+) voltage is applied to the doping material 400, and a (−) voltage is applied to the doped layer 200. Here, the applied voltage generates an electric field in the sacrificial layer 300, and the electric field oxidizes the doping material 400 to be ionized.

Referring to FIG. 1C, the ionized doping material diffuses to the sacrificial layer 300 and then reaches the doped layer 200 and encounters electrons accumulated in the doped layer 200 to be reduced.

Figure 2A:
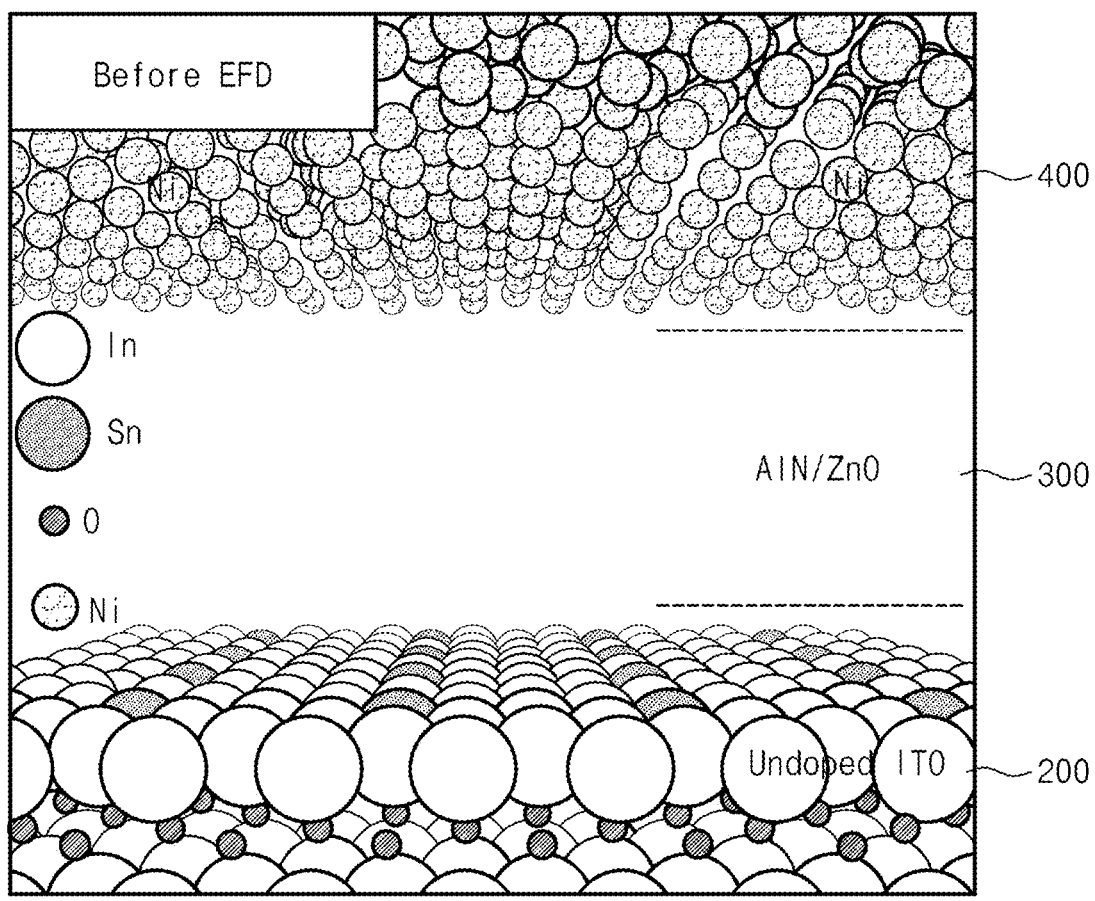
FIGS. 2A to 2C are views illustrating atomic diffusion of a doping material through a sacrificial layer in a doping method using an electric field according to an embodiment of the inventive concept.
Figure 2B:
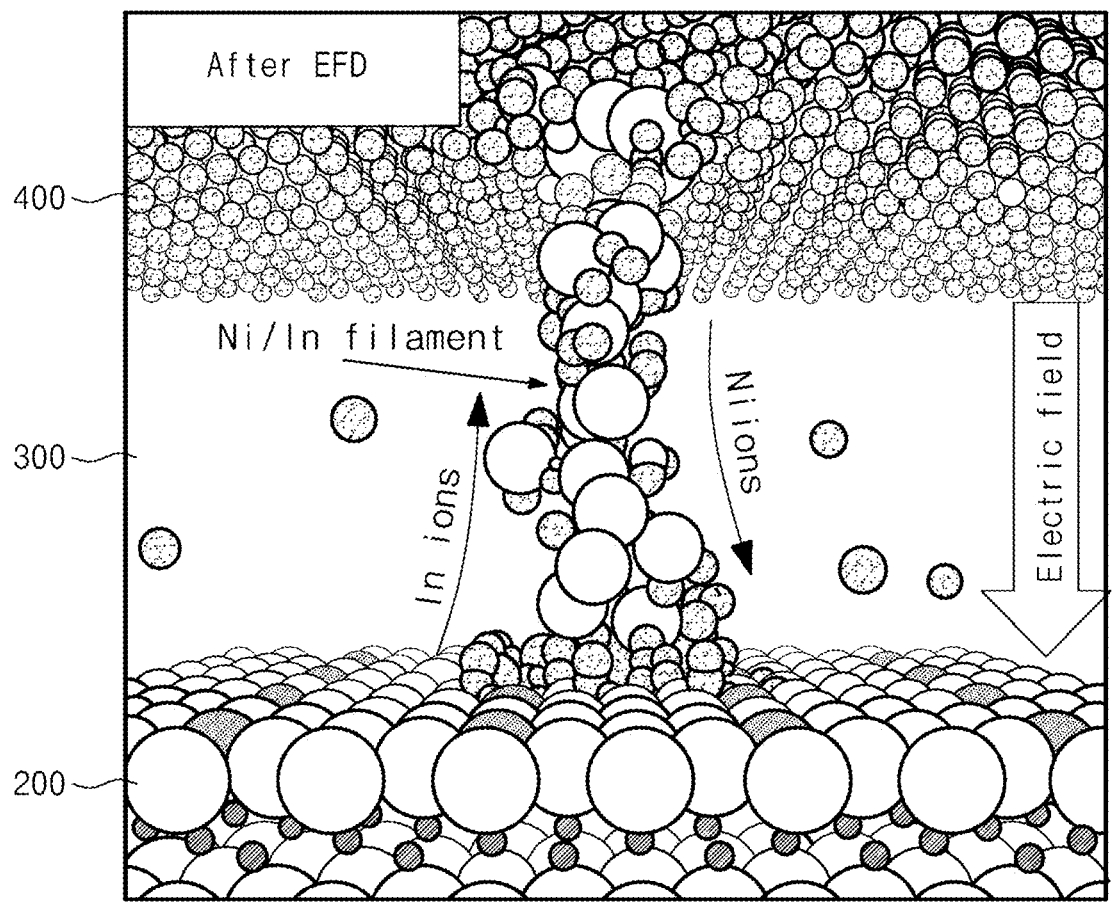
Figure 2C:
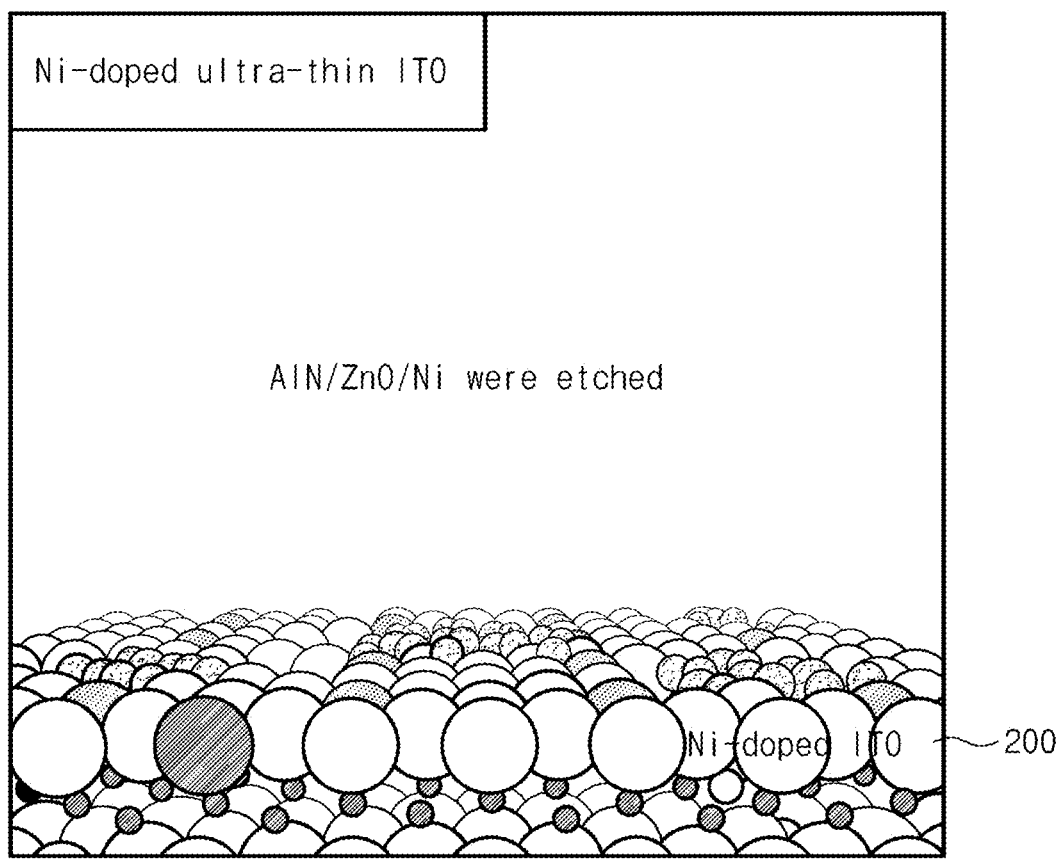

FIGS. 2A to 2C are views illustrating atomic diffusion of the doping material 400 through the sacrificial layer 300 in a doping method using an electric field according to an embodiment of the inventive concept.

Referring to FIG. 2A, an ITO electrode may be provided with the doped layer 200.

The ITO electrode refers to that conductivity is further increased by adding tin of about 10% to indium oxide having conductivity. Thus, the ITO includes indium (In), tin (Sn), and oxygen (O).

The ITO electrode is usually formed by placing a glass plate in a vacuum container and then forming an indium oxide film in which tin is added to a surface of the glass plate through vacuum discharge.

The sacrificial layer 300 is provided with a thin dielectric layer of several tens of nanometers in thickness.

For example, the sacrificial layer 300 may include at least one of aluminum nitride (AlN) and zinc oxide (ZnO).

The doping material 400 has conductivity and may be provided with a material that is capable of being ionized.

For example, the doping material 400 may be provided with a nickel (Ni) metal.

Referring to FIG. 2B, as mentioned in FIG. 1B, when the (+) electrode is applied to the doping material 400 and the (−) electrode is applied to the doped layer 200, the electric field is downward formed in the sacrificial layer 300, which is a dielectric layer.

Here, the sacrificial layer 300 is provided with a thin layer of tens of nanometers and thus a large electric field may be formed in the sacrificial layer 300 although a low voltage is applied.

For example, when the sacrificial layer is provided in tens of nanometers and the voltage is provided in about 10 volts, a large electric field of MV/cm may be formed in the sacrificial layer 300.

The large electric field formed in the sacrificial layer 300 oxidizes the doping material 400, and the oxidized doping material 400 is converted into an ionic state.

For example, when nickel (Ni) is provided as the doping material 400, nickel may be oxidized to nickel cations.

The nickel cations are attracted by the (−) voltage applied to the doped layer 200 to be diffused into the sacrificial layer 300 and pass through the sacrificial layer 300 to reach the doped layer 200.

Referring to FIG. 2C, the nickel cations reaching the doped layer 200 encounter the electrons accumulated in the doped layer 200 to be reduced. Here, some nickel cations are partially inserted into an interior of the doped layer 200 to be reduced in the doped layer 200 as well as a surface of the doped layer 200.

That is, the doped layer 200 is doped by the reduced nickel cations on the surface of the doped layer 200 and a portion of an upper portion of the doped layer 200.

Figure 3:
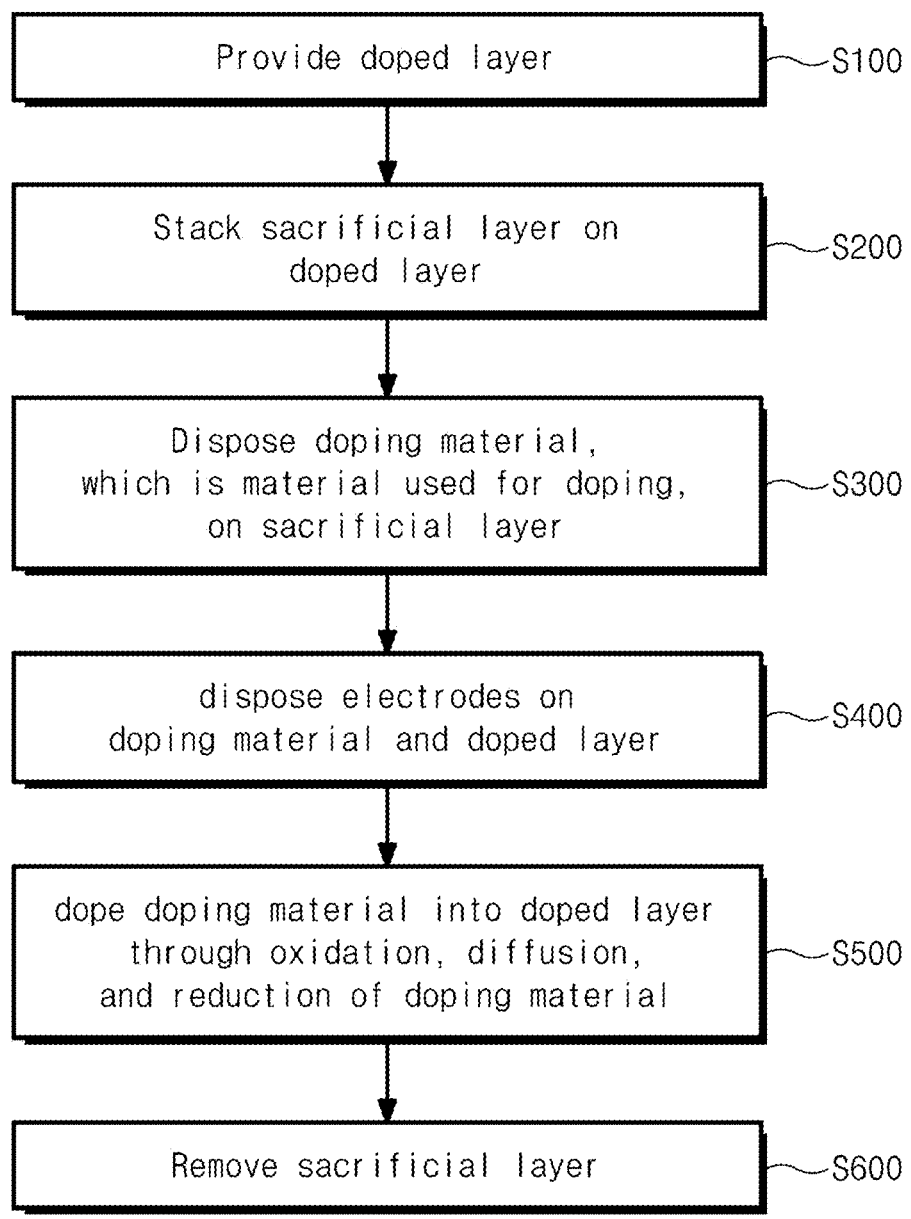
FIG. 3 is a block diagram illustrating a doping method using an electric field according to an embodiment of the inventive concept.

FIG. 3 is a flowchart illustrating a doping method using an electric field according to an embodiment of the inventive concept.

Referring to FIG. 3, a doping method using an electric field includes providing a doped layer in S100, stacking a sacrificial layer on the doped layer in S200, disposing a doping material, which is a material used for doping, on the sacrificial layer in S300, disposing electrodes on the doping material and the doped layer in S400, doping the doping material into the doped layer through oxidation, diffusion, and reduction of the doping material in S500, and removing the sacrificial layer in S600.

Figure 4:
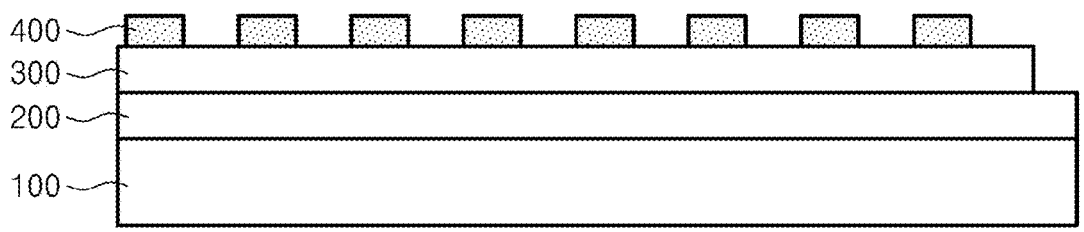
FIG. 4 is a view schematically illustrating operations S100 to S300 of FIG. 3.

FIG. 4 is a view schematically illustrating operations S100 to S300 of FIG. 3.

Referring to FIG. 4, the doped layer 200 is stacked on the substrate 100. The sacrificial layer 300 is stacked on the doped layer 200, and the doping material 400 is disposed on the sacrificial layer 300.

Although the substrate 100 is illustrated in FIG. 4, the substrate 100 may be omitted according to an embodiment.

For example, the doped layer 200 may be provided with indium tin oxide (ITO), a metal oxide film, graphene, carbon nanotubes, metal mesh, and metal nanowires. In addition, a semiconductor material including silicon or GaN may be provided with the doped layer 200.

However, it is not limited thereto, and a material having electrical conductivity may be applied without limitation.

The sacrificial layer 300 is stacked on the doped layer 200.

The sacrificial layer 300 may be provided with a dielectric layer having a thickness of several tens of nanometers, and may be provided at a thickness of 10 nanometers to 20 nanometers.

For example, the sacrificial layer 300 may be provided with aluminum nitride (AlN) or zinc oxide (ZnO).

The sacrificial layer 300 may be stacked through a physical vapor deposition (PVD) method, a chemical vapor deposition (CVD) method, or an atomic layer deposition (ALD) method.

The physical vapor deposition method refers to a method in which a metal is vaporized, the vaporized metal atoms are plated on a plated subject without an obstruction while not being oxidized, and are classified into a vacuum deposition method, a sputtering method, and an ion plating method.

It is possible to plate aluminum, titanium, or a high melting point material. In addition, when a metal and a nonmetal atom are ionized to be reacted in a vacuum, a compound coating layer having abrasion resistance, heat resistance, other functional properties, such as titanium carbide, titanium nitride, alumina, aluminum nitride, silicon carbide, or the like, may be plated.

The chemical vapor deposition method refers to a method in which a raw material gas is flowed on a coated substrate and external energy is applied to decompose the raw material gas and then a thin layer is formed in a gas phase reaction.

The atomic layer deposition method refers to a nano-sized thin layer deposition technique using a phenomenon of a monoatomic layer that chemically sticks during a semiconductor manufacturing process.

Molecules may be alternately adsorbed and displaced on a surface of a wafer to perform ultra-fine layer-by-layer deposition of atomic layers, oxide and metal thin layer may be stacked as thin as possible, and the atomic layer deposition method may form a thin layer at a lower temperature (below 500 degrees) than the chemical vapor deposition (CVD) which deposits particles formed by a chemical reaction of gas on the wafer surface, thereby being suitable for system-on-chip (SoC) manufacturing.

However, the method of the stacking of the sacrificial layer 300 is not limited thereto, and any method capable of forming a thin layer having a thickness of several tens of nanometers is applicable without limitation.

The doping material 400, which is the material to be doped into the doped layer, is provided on the sacrificial layer 300.

The doping material 400 may be provided in some areas on the sacrificial layer 300, or alternatively, may be provided in a layer shape covering a top surface of the sacrificial layer 300.

As mentioned above, the doping material 400 may have conductivity including nickel and may be provided with an ionizable material.

Figure 5:
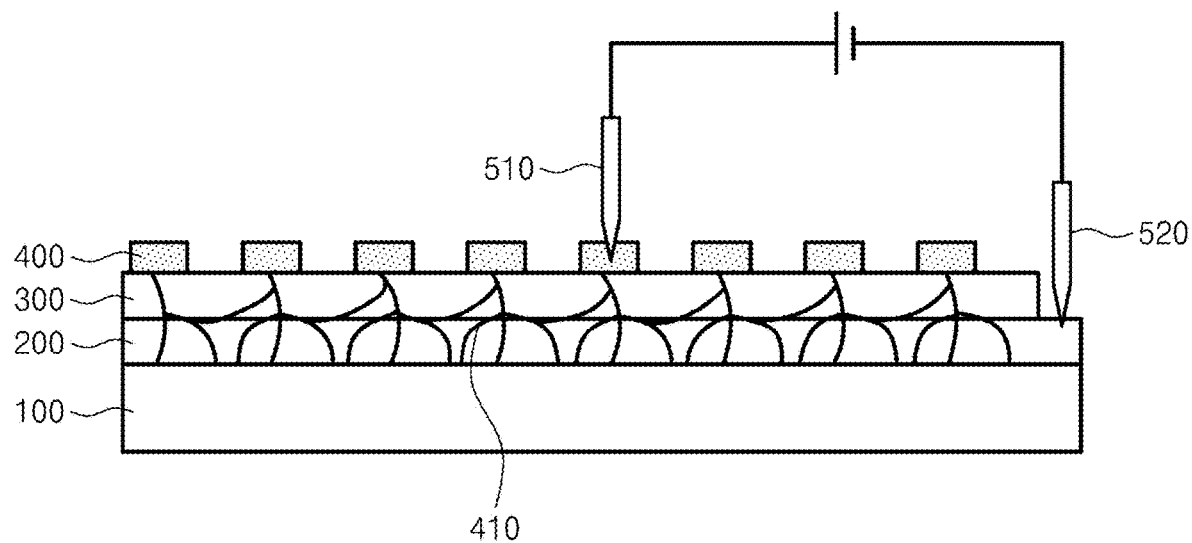
FIG. 5 is a diagram schematically illustrating operations S400 and S500 of FIG. 3.

FIG. 5 is a diagram schematically illustrating operations S400 and S500 of FIG. 3.

Referring to FIG. 5, the doping of the doping material 400 into the doped layer 200 through the oxidation, diffusion, and reduction of the doping material 400 includes oxidizing in which the doping material 400 is ionized, diffusing the ionized doping material 410, which passes through the sacrificial layer 300 to diffuse into the doped layer 200, and reducing the ionized doping material 410 reaching the doped layer 200.

The electrodes 510, 520 are disposed on the doping material 400 and the doped layer 200.

According to an example, a first electrode 510 may be provided to the doping material 400 and a second electrode 520 may be provided to the doped layer 200.

Here, the first electrode 510 may be provided with an anode and the second electrode 520 may be provided with a cathode.

When a dielectric is disposed between two electrodes, an electric field is formed in the dielectric.

In an example of the inventive concept, the first electrode 510 is provided with the anode and the second electrode 520 is provided with the cathode and thus a direction of the electric field is directed downward of the sacrificial layer 300.

The electric field is defined as follows.

$$\bar{E} = \frac{V}{d}$$

At this time, "E" is electric field strength, "V" is electrical signal strength, "d" is a thickness of the dielectric.

The sacrificial layer 300 is provided with a thin layer of nanometer thickness.

For example, the thickness of the sacrificial layer 300 may be provided in 10 nanometers (nm) to 20 nanometers. However, the inventive concept is not limited thereto, and may be provided with a thin layer of several micrometers to tens of micrometers.

A voltage of several volts is applied between the first electrode 510 and the second electrode 520.

For example, a direct current voltage or a pulse voltage of 3 volts (V) to 10 volts may be applied between the first electrode 510 and the second electrode 520. However, a magnitude of the voltage is not limited thereto, and a voltage of several volts (V) to tens of volts may be applied.

That is, when a voltage of several volts is applied to the sacrificial layer 300 having a thickness of several tens of micrometers, a large electric field of MV/cm is formed in the sacrificial layer 300.

The electric field formed on the sacrificial layer 300 oxidizes the doping material 400 disposed on the sacrificial layer 300 to form the ionized doping material 410.

For example, when the doping material 400 is provided with a nickel metal, the nickel metal is oxidized to a nickel cation.

The ionized doping material 410 passes through the sacrificial layer 300 by electrostatic attraction of a negative charge applied to the doped layer 200 and diffuses into a direction of the doped layer 200.

The ionized doping material 410 reaching the doped layer 200 is combined with electrons supplied through the negative electrode applied to the doped layer 200.

The ionized doping material 410 is reduced due to bonding with electrons, and in this process, the doping material 400 is doped on the surface of the doped layer 200.

Here, the ionized doping material 410 may be reduced to the doping material 400 after penetrating into the surface of the doped layer 200 as well as a portion of the upper portion of the doped layer 200.

Figure 6:
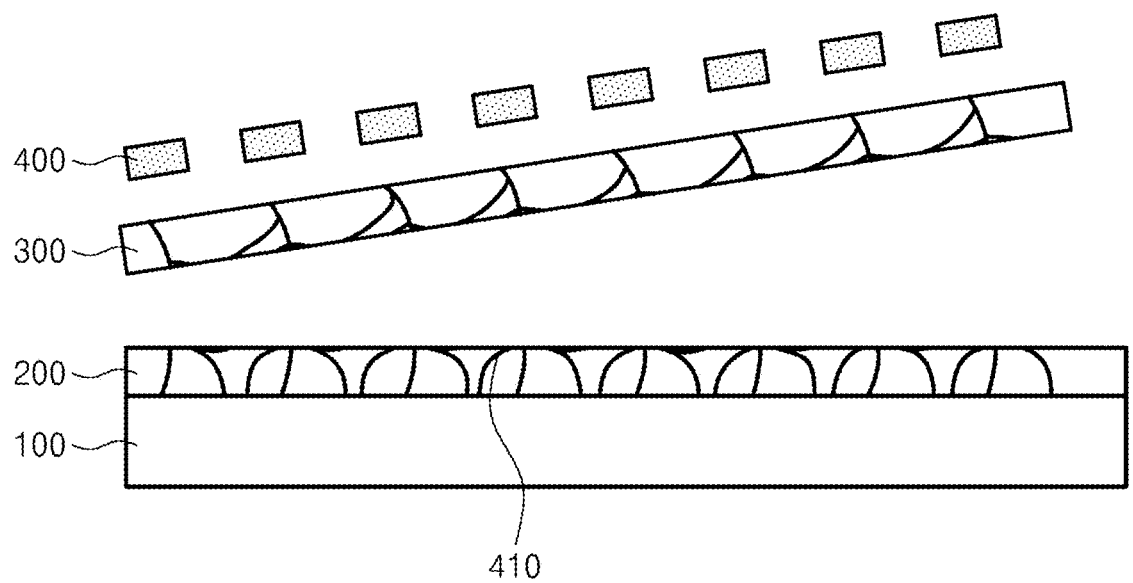
FIG. 6 is a schematic view illustrating operation S600 of FIG. 3.

FIG. 6 is a schematic view illustrating operation S600 of FIG. 3.

Referring to FIG. 6, the sacrificial layer 300 may be removed using a corrosive solution. In this process, the doping material 400 disposed on the sacrificial layer 300 is also removed with the sacrificial layer 300.

For example, the corrosion solution includes iron ferric chloride, ammonia persulfate, or chromic acid.

When the corrosive solution removes the sacrificial layer 300 due to chemical etching, the doping material 400 disposed on the top surface of the sacrificial layer 300 may also be removed naturally in the process.

Figure 7:
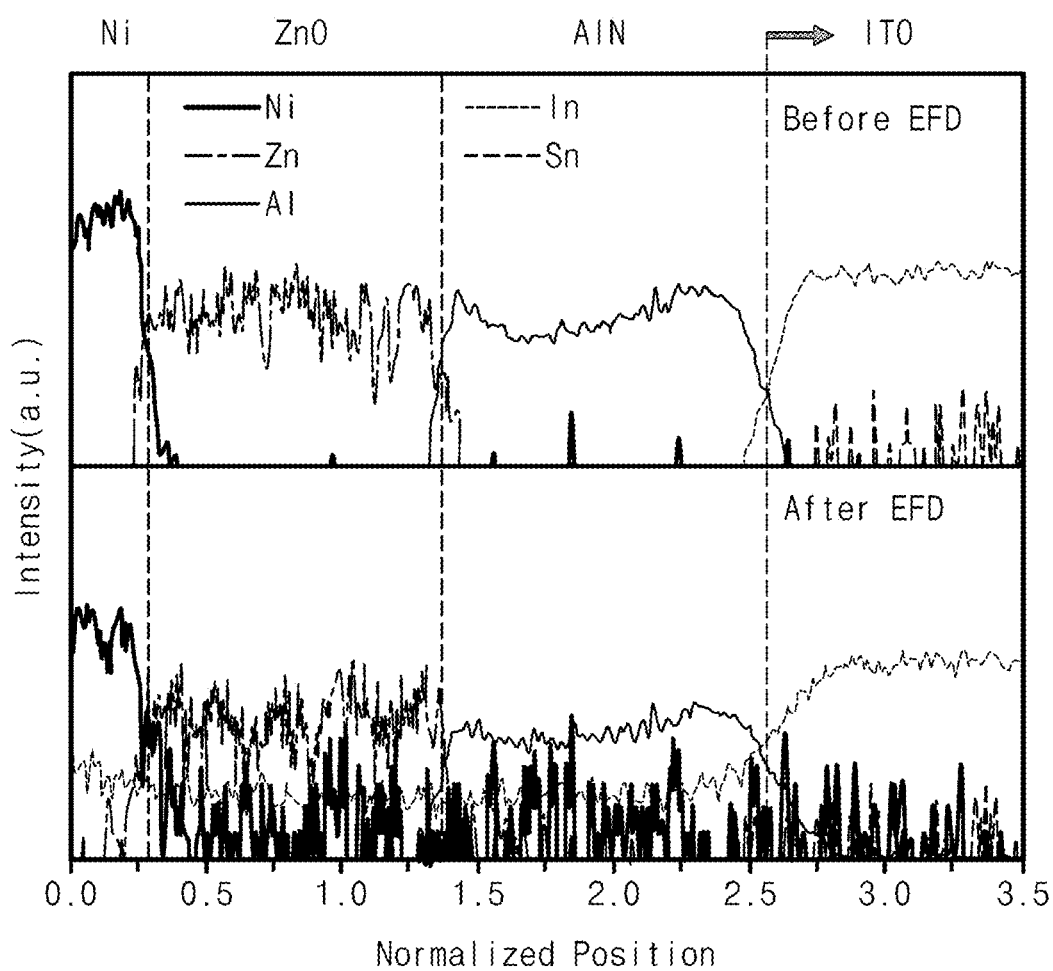
FIG. 7 is a table illustrating a change in a distribution of each atom depending on doping.

FIG. 7 is a table illustrating a change in a distribution of each atom depending on doping.

Referring to FIG. 7, an upper part of the drawing illustrates a state before doping and a lower part of the drawing illustrates a state after doping is performed.

A doping process was performed at room temperature, and a voltage was applied from 0V to 17V. Here, the doping process using an electric field was performed at 12V, and when converted into electric field energy, the electric field of 12V corresponds to about 2 MV/cm. In addition, a compliance current was set to 100 uA to minimize damage to a thin layer during the process. In this process, the doping material 400 was provided with nickel (Ni), the sacrificial layer 300 was provided with zinc oxide (ZnO) and aluminum nitride (AlN), and the doped layer 200 was provided with ITO.

When comparing the upper and lower parts of the drawing, it was seen that the nickel provided with the doping material 400 diffused beyond a region where the doping material 400 was initially provided to a region of the doped layer 200.

That is, through the doping method according to an embodiment of the inventive concept, it was seen that the doping material 400 passed through the sacrificial layer 300 to successfully reach the doped layer 200 to dope the doped layer 200.

Figure 8:
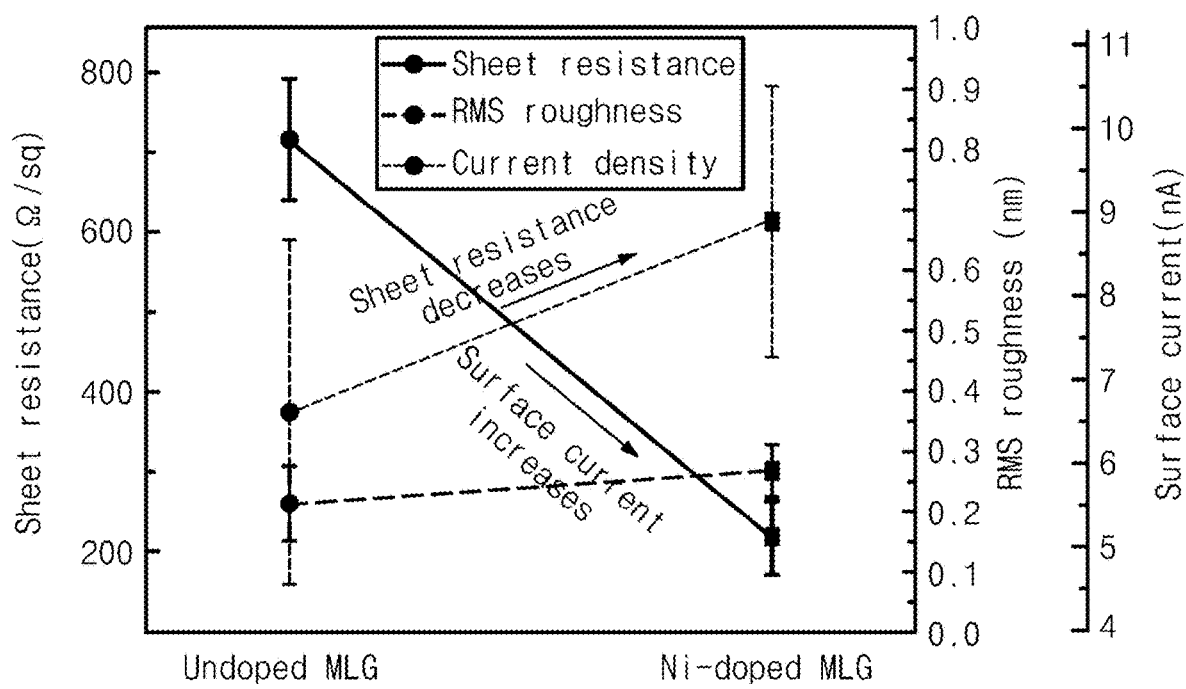
FIG. 8 is a graph illustrating changes in sheet resistance, RMS roughness, and sheet current depending on doping.

FIG. 8 is a graph illustrating changes in sheet resistance, RMS roughness, and sheet current depending on nickel (Ni) doping.

Referring to FIG. 8, it was seen that after nickel (Ni) doping, the sheet resistance was reduced, the RMS roughness was hardly changed, and the surface current was increased.

Figure 9:
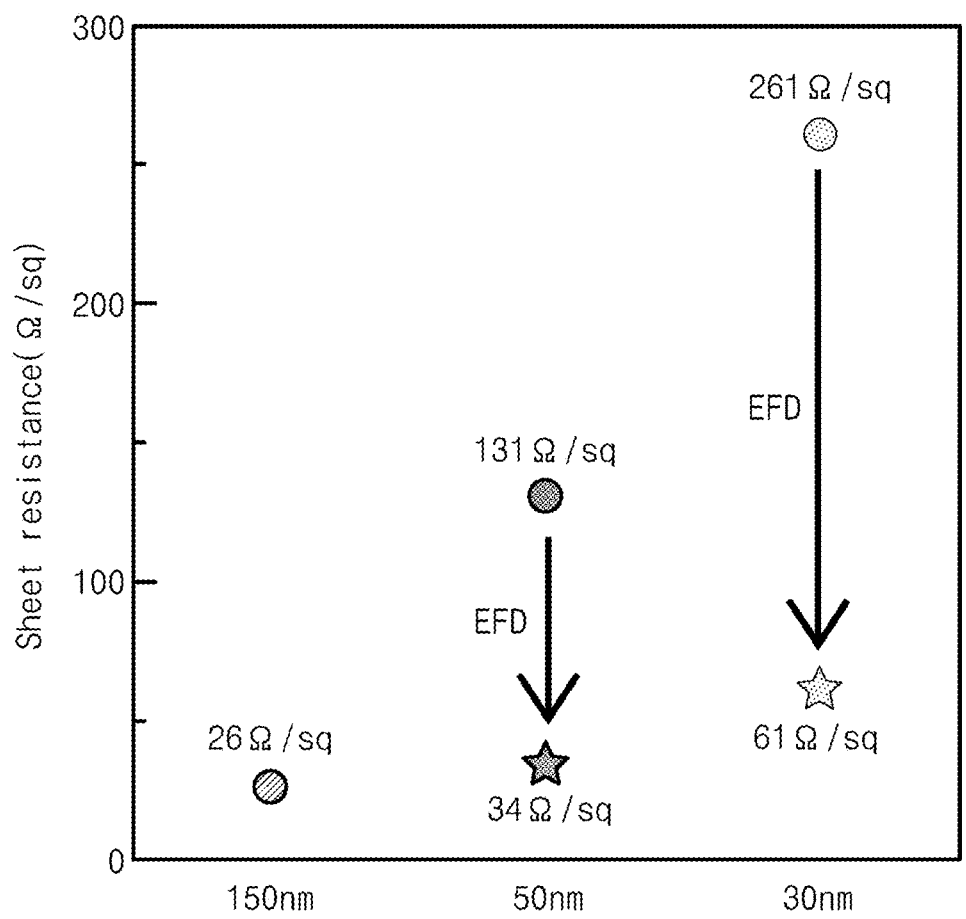
FIG. 9 is a graph illustrating a change in sheet resistance depending on doping.

FIG. 9 is a graph illustrating a change in sheet resistance depending on nickel (Ni) doping.

Referring to FIG. 9, when the thickness of the doped layer 200 was 30 nm, the initial sheet resistance, which was 261 Ω/sq, was reduced to 61 Ω/sq. In addition, when the thickness of the doped layer 200 was 50 nm, the initial sheet resistance, which was 131 Ω/sq, was reduced to 34 Ω/sq.

That is, it was seen that the surface resistance of the doped layer 200 was largely reduced due to nickel (Ni) doping.

Figure 10A:
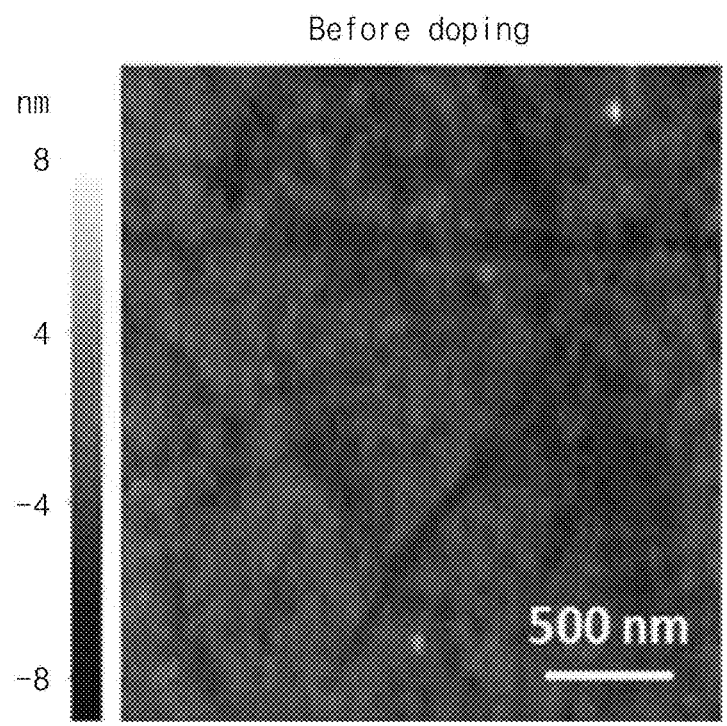
FIGS. 10A and 10B are photographs illustrating a change in RMS roughness depending on doping.
Figure 10B:
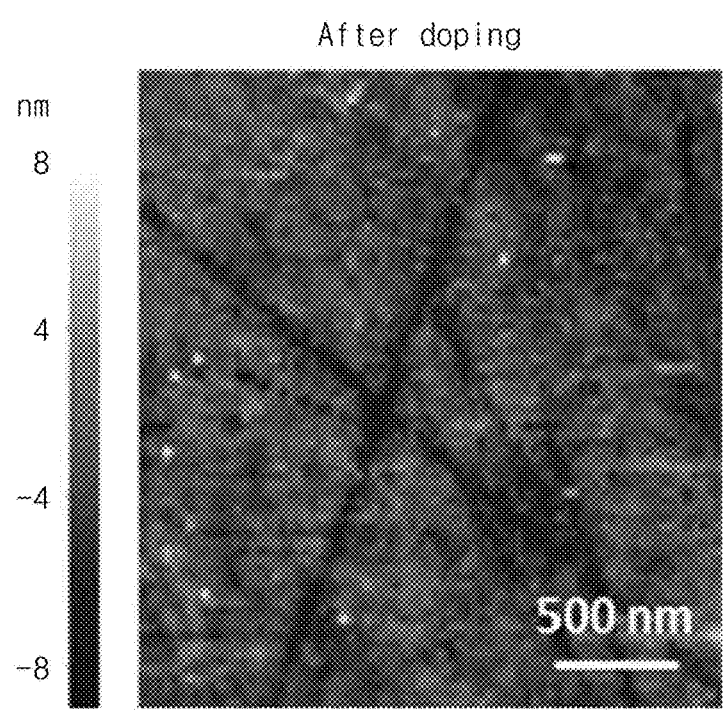

FIGS. 10A and 10B are photographs illustrating a change in RMS roughness depending on doping.

Referring to FIGS. 10A and 10B, it was seen that there was no large change in roughness even after nickel (Ni) doping and it was seen that even when referring to the change in the RMS roughness graph of FIG. 8, the roughness did not show a large change.

Figure 11A:
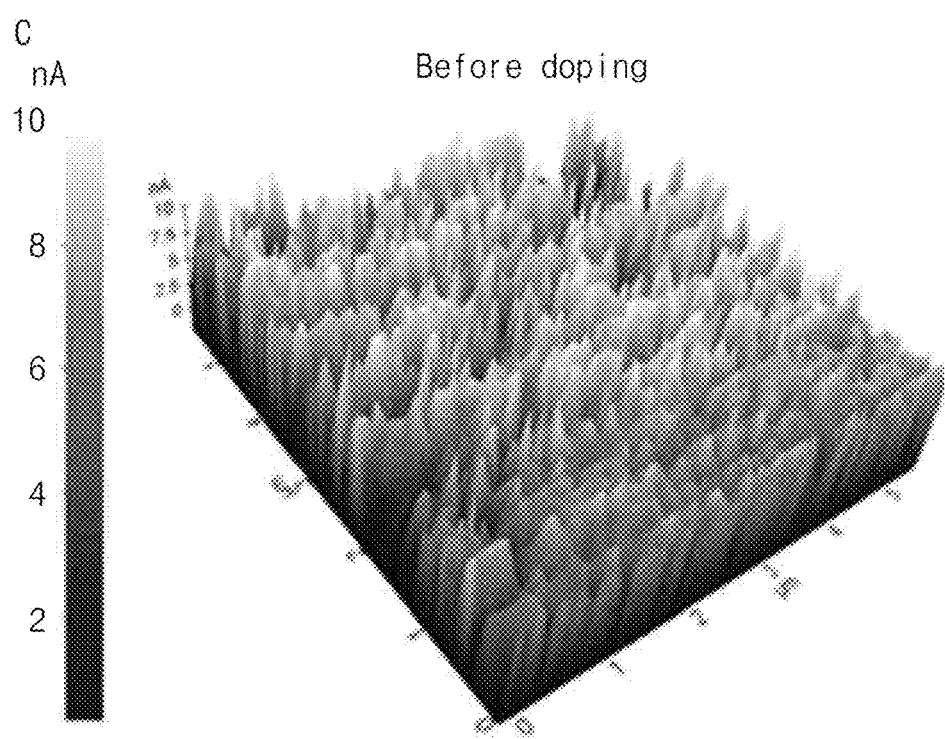
FIGS. 11A and 11B are photographs illustrating a change in surface current depending on doping.
Figure 11B:
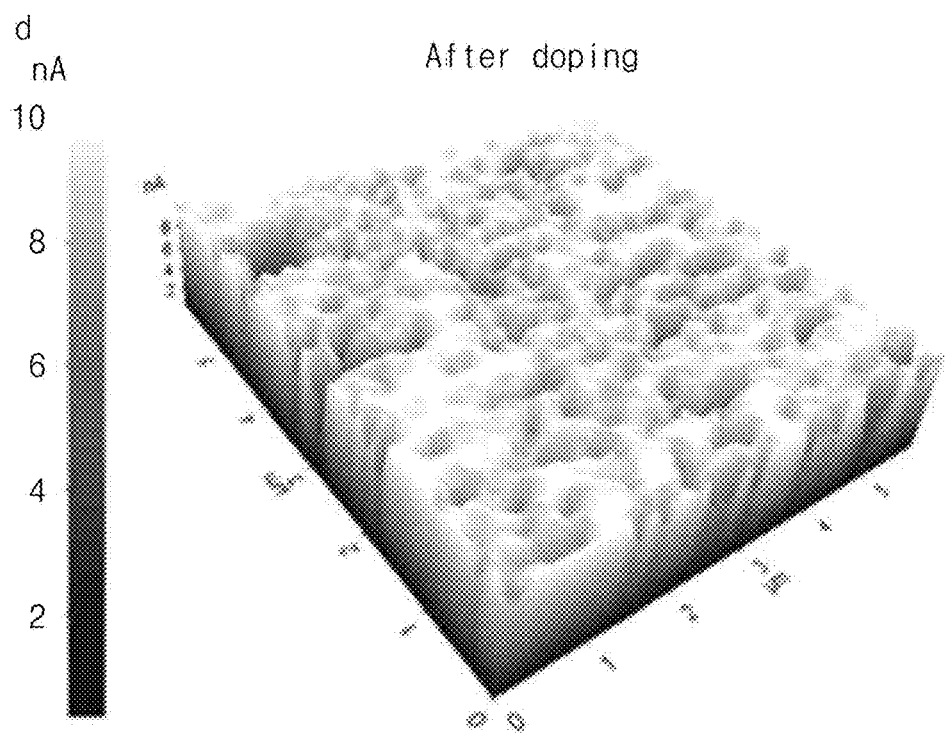

FIGS. 11A and 11B are photographs illustrating a change in surface current depending on doping.

Referring to FIGS. 11A and 11B, it was seen that the surface current is increased after nickel (Ni) doping and it was seen that the surface current is increased even when the change in the surface current graph of FIG. 8 was also referred to.

Figure 12:
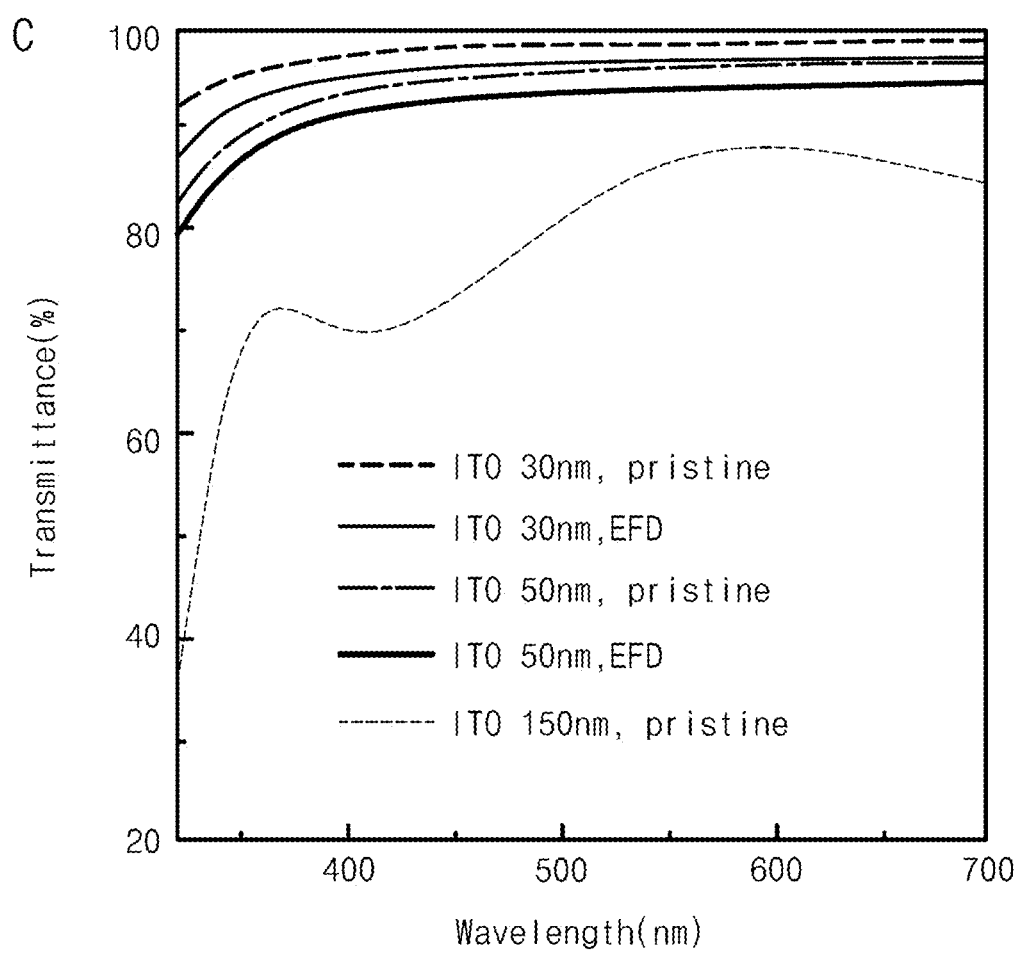
FIG. 12 is a graph illustrating a change in transmittance depending on doping.

FIG. 12 is a graph illustrating a change in transmittance depending on doping

Referring to FIG. 12, when the thickness of the doped layer 200 was 30 nm after nickel (Ni) doping, the change in transmittance value of 1.6% is occurred and when the thickness of the doped layer 200 was 50 nm, the change in transmittance value of 2.2% is occurred.

That is, it was seen that even when nickel (Ni) was doped in the doped layer 200, the transmittance value hardly changes.

In the doping method using the electric field according to an embodiment of the inventive concept, after the doped layer 200, the sacrificial layer 300, and the doping material 400 are sequentially stacked, the electric field is generated in the sacrificial layer 300 through the electrodes disposed on the doped layer 200 and the doping material 400. Here, the generated electric field may oxidize, diffuse, and reduce the doping material 400 to dope the doping material 400 into the doped layer 200 in room temperature and atmospheric pressure atmosphere.

The doping method using the electric field according to an embodiment of the inventive concept may be performed even at room temperature and atmospheric pressure.

Meanwhile, effects obtainable from the inventive concept may be non-limited by the above mentioned effect. And, other unmentioned effects may be clearly understood from the following description by those having ordinary skill in the technical field to which the inventive concept pertains.

The inventive concept has been described above with reference to the embodiments, but this is merely described, for example, the technical idea of the inventive concept, and thus is not limited thereto. It should be understood that various embodiments of the inventive concept are conceivable to a person skilled in the art. The scope of the inventive concept will depend only upon the appended claims.

What is claimed is:

1. A doping method using an electric field comprising:
    stacking a sacrificial layer on a doped layer;
    disposing a doping material on the sacrificial layer;
    disposing electrodes on the doping material and the doped layer, respectively; and
    doping the doping material into the doped layer through oxidation, diffusion, and reduction of the doping material by the electric field.

2. The doping method using the electric field of claim 1, wherein the doping of the doping material into the doped layer includes:
    oxidizing and ionizing the doping material;
    diffusing the ionized doping material by passing though the sacrificial layer by electrostatic attraction;
    allowing the ionized doping material to pass though the sacrificial layer by electrostatic attraction to be diffused into the doped layer; and
    reducing the diffused doping material in the doped layer.

3. The doping method using the electric field of claim 1, further comprising:
    removing the sacrificial layer after the doping of the doping material into the doped layer.

4. The doping method using the electric field of claim 1, wherein the doped layer includes at least one of ITO, a metal oxide film, graphene, carbon nanotubes, metal mesh, and metal nanowires.

5. The doping method using the electric field of claim 1, wherein the sacrificial layer is provided with a dielectric material.

6. The doping method using the electric field of claim 5, wherein the dielectric material includes at least one of aluminum nitride (AlN) and zinc oxide (ZnO).

7. The doping method using the electric field of claim 1, wherein the sacrificial layer is 10 nanometers to 20 nanometers.

8. The doping method using the electric field of claim 1, wherein the disposing of the electrode on the doping material and the doped layer, respectively, includes:
    disposing a first electrode on the doping material; and
    disposing a second electrode on the doped layer.

9. The doping method using the electric field of claim 8, wherein the first electrode is a positive electrode and the second electrode is a negative electrode.

* * * * *